(12) United States Patent
Itamoto

(10) Patent No.: US 12,507,351 B2
(45) Date of Patent: Dec. 23, 2025

(54) SUBSTRATE JOINING STRUCTURE

(71) Applicant: Mitsubishi Electric Corporation, Tokyo (JP)

(72) Inventor: Hiromitsu Itamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 191 days.

(21) Appl. No.: 18/576,236

(22) PCT Filed: Dec. 20, 2021

(86) PCT No.: PCT/JP2021/047007
§ 371 (c)(1),
(2) Date: Jan. 3, 2024

(87) PCT Pub. No.: WO2023/119357
PCT Pub. Date: Jun. 29, 2023

(65) Prior Publication Data
US 2024/0314943 A1 Sep. 19, 2024

(51) Int. Cl.
*H05K 3/46* (2006.01)
*H05K 1/14* (2006.01)
*H05K 3/36* (2006.01)

(52) U.S. Cl.
CPC ........... *H05K 3/4691* (2013.01); *H05K 1/144* (2013.01); *H05K 1/147* (2013.01); *H05K 3/363* (2013.01); *H05K 2201/09572* (2013.01)

(58) Field of Classification Search
CPC ........ H05K 3/46; H05K 3/4691; H05K 1/144; H05K 1/147; H05K 3/363; H05K 2201/09572

USPC ......................................................... 174/250
See application file for complete search history.

(56) References Cited

U.S. PATENT DOCUMENTS

| 2016/0356955 A1 | 12/2016 | Sugiyama |
| 2018/0199445 A1 | 7/2018 | Usui et al. |
| 2020/0064971 A1 | 2/2020 | Suto |

FOREIGN PATENT DOCUMENTS

| JP | S59-41894 A | 3/1984 |
| JP | H10-70347 A | 3/1998 |
| JP | 2017-003655 A | 1/2017 |
| KR | 10-2019-0040245 A | 4/2019 |

(Continued)

OTHER PUBLICATIONS

International Search Report issued in PCT/JP2021/047007; mailed Mar. 15, 2022.

(Continued)

*Primary Examiner* — Tremesha W Burns
(74) *Attorney, Agent, or Firm* — Studebaker Brackett PLLC

(57) ABSTRACT

Solder (12) joins together a second conductive pattern (4) of a flexible substrate (1) and a third conductive pattern (7) of a print substrate (6) and joins together a second GND pattern (5) of the flexible substrate (1) and a third GND pattern (8) of the print substrate (6). A through hole (11) passes through the flexible substrate (1) and connects the first and second GND patterns (3,5) together. In an extension direction in which the second conductive pattern (4) extends, an end portion of a solder joint portion between the second conductive pattern (4) and the third conductive pattern (7) is in a position corresponding to the through hole (11) and is shifted from an end portion of the through hole (11).

7 Claims, 15 Drawing Sheets

(56) References Cited

FOREIGN PATENT DOCUMENTS

WO 2016/203774 A1 12/2016

OTHER PUBLICATIONS

An Office Action; issued by the Taiwanese Intellectual Property Office on Aug. 2, 2023, which corresponds to Taiwanese Patent Application No. 111143340.
An Office Action mailed by the Korean Intellectual Property Office on Mar. 19, 2025, which corresponds to Korean Patent Application No. 10-2024-7007007 and is related to U.S. Appl. No. 18/576,236; with English language translation.

UPPER SURFACE OF
FLEXIBLE SUBSTRATE

LOWER SURFACE OF
FLEXIBLE SUBSTRATE

UPPER SURFACE OF
FLEXIBLE SUBSTRATE

LOWER SURFACE OF
FLEXIBLE SUBSTRATE

SUBSTRATE JOINING STRUCTURE

FIELD

The present disclosure relates to a substrate joining structure.

BACKGROUND

In an optical module or the like, a pattern of a flexible substrate and a pattern of a print substrate are joined together by solder. Breaking of wire in the pattern of the flexible substrate is likely to occur in an end portion of a solder joint portion of the pattern. Accordingly, in order to prevent breaking of wire, a suggestion has been made that a protrusion portion be provided in a coverlay film covering the pattern and the end portion of the solder joint portion be thereby shifted from a part where the flexible substrate bends (for example, see PTL 1).

CITATION LIST

Patent Literature

[PTL 1] JP 2017-3655 A

SUMMARY

Technical Problem

However, because a manufacture tolerance of a coverlay film is large, the coverlay film is likely to be shifted in manufacturing. Thus, there has been a problem that an end portion of a solder joint portion is not sufficiently shifted from a part where a flexible substrate bends and breaking of wire occurs in a pattern.

The present disclosure has been made for solving the above-described problems, and an object thereof is to obtain a substrate joining structure that can prevent breaking of wire in a pattern.

Solution to Problem

A semiconductor device according to the present disclosure includes: a flexible substrate; a first conductive pattern and a first GND pattern provided side by side on an upper surface of the flexible substrate: a second conductive pattern and a second GND pattern provided side by side on a lower surface of the flexible substrate; and a print substrate; a third conductive pattern and a third GND pattern provided side by side on an upper surface of the print substrate; and solder joining together the second conductive pattern and the third conductive pattern and joining together the second GND pattern and the third GND pattern, wherein a through hole passes through the flexible substrate and connects the first and second GND patterns together, and in an extension direction in which the second conductive pattern extends, an end portion of a solder joint portion between the second conductive pattern and the third conductive pattern is in a position corresponding to the through hole and is shifted from an end portion of the through hole.

Advantageous Effects of Invention

In the present disclosure, the through hole is provided which pass through the flexible substrate and connect the first and second GND patterns together. A manufacture tolerance of the through hole is as small. In the extension direction in which the second conductive pattern extends, the end portion of the solder joint portion between the second conductive pattern and the third conductive pattern is in the position corresponding to the through hole and is shifted from the end portion of the through hole. A stress concentration point in bending of the flexible substrate is positioned in the end portion of the through hole, a stress is not exerted on the end portion of the solder joint portion, and breaking of wire can thus be prevented.

DESCRIPTION OF EMBODIMENTS

A substrate joining structure according to the embodiments of the present disclosure will be described with reference to the drawings. The same components will be denoted by the same symbols, and the repeated description thereof may be omitted.

First Embodiment

Figure 1:
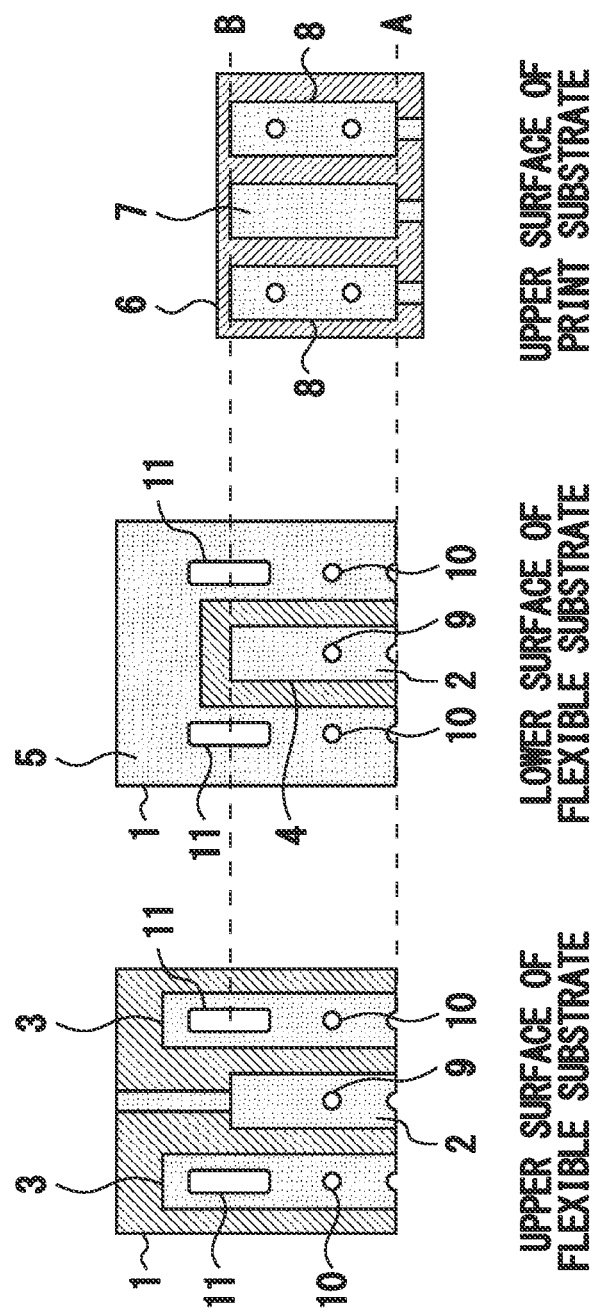
FIG. 1 is a diagram illustrating upper and lower surfaces of a flexible substrate and an upper surface of a print substrate, according to a first embodiment.

FIG. 1 is a diagram illustrating upper and lower surfaces of a flexible substrate and an upper surface of a print substrate, according to a first embodiment. On an upper surface of a flexible substrate 1, a conductive pattern 2 and GND patterns 3 are provided side by side in parallel with each other. On a lower surface of the flexible substrate 1, a conductive pattern 4 and a GND pattern 5 are provided side by side in parallel with each other. On an upper surface of a print substrate 6, a conductive pattern 7 and GND patterns 8 are provided side by side in parallel with each other.

The conductive patterns 2, 4, and 7 and the GND patterns 3, 5, and 8 are copper foil, and gold plating is applied to their surfaces.

A through hole 9 is provided which passes through the flexible substrate 1 and couples the conductive patterns 2 and 4 together. Through holes 10 and rectangular through holes 11 are provided which pass through the flexible substrate 1 and couple the GND patterns 3 and 5 together. Note that the through hole 11 may be in an elliptical shape or a rhombic shape.

Figure 2:
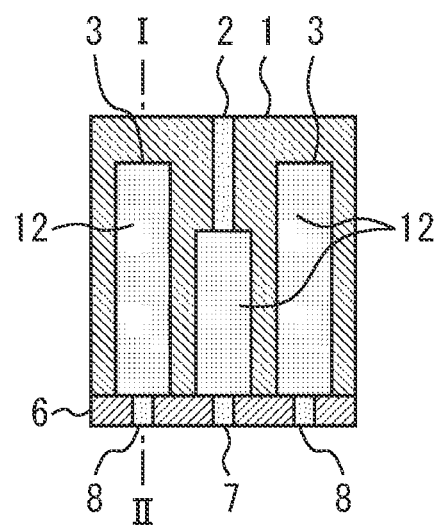
FIG. 2 is a top view illustrating a substrate joining structure according to the first embodiment.
Figure 3:
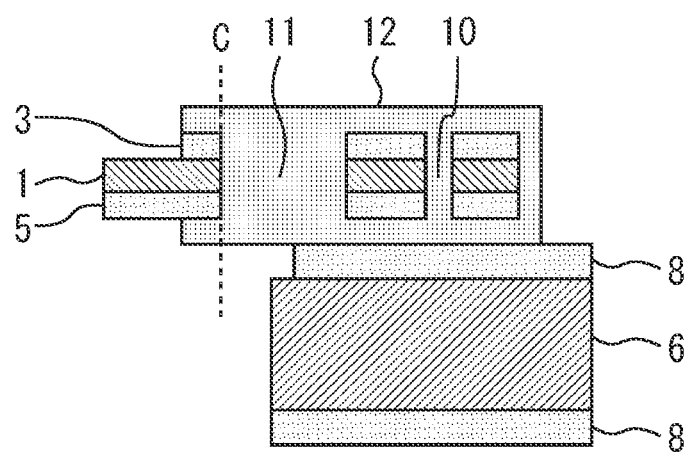
FIG. 3 is a cross-sectional view taken along line I-II in FIG. 2.

FIG. 2 is a top view illustrating a substrate joining structure according to the first embodiment. FIG. 3 is a cross-sectional view taken along line I-II in FIG. 2. In the substrate joining structure, the flexible substrate 1 and the print substrate 6 are joined together by solder. Solder 12 joins together the conductive pattern 4 of the flexible substrate 1 and the conductive pattern 7 of the print substrate 6, which are positioned, and joins together the GND pattern 5 and the GND patterns 8. In joining, a distal end portion of the flexible substrate 1 is aligned to a position of a dotted line A in FIG. 1 in the print substrate 6, and end portions of the conductive pattern 4 of the flexible substrate 1 and of the conductive pattern 7 of the print substrate 6 are aligned to a position of a dotted line B.

The through hole 9 is filled with the solder 12, and the conductive pattern 2 on the upper surface side and the conductive pattern 4 on the lower surface side are thereby electrically connected together. Similarly, the through hole 10 and 11 are filled with the solder 12, and the GND patterns 3 on the upper surface side and the GND pattern 5 on the lower surface side of the flexible substrate 1 are thereby electrically connected together. Note that in order to improve wetting-spreading characteristics of the solder 12, metallization is performed for side surfaces of the through holes 9, 10, and 11, but metallization does not have to be performed.

In an extension direction in which the conductive pattern 4 extends, an end portion of a solder joint portion between the conductive pattern 4 and the conductive pattern 7 is in a position corresponding to the through holes 11 and is shifted from end portions of the through holes 11 (see the dotted line B in FIG. 1). It is preferable that the end portion of the solder joint portion be positioned at a center of a long side of the through hole 11. Note that a center position of the long side of the through hole 11 may be set to a substrate end of the print substrate 6 or to an end portion of the conductive pattern 7, for example.

Figure 4:
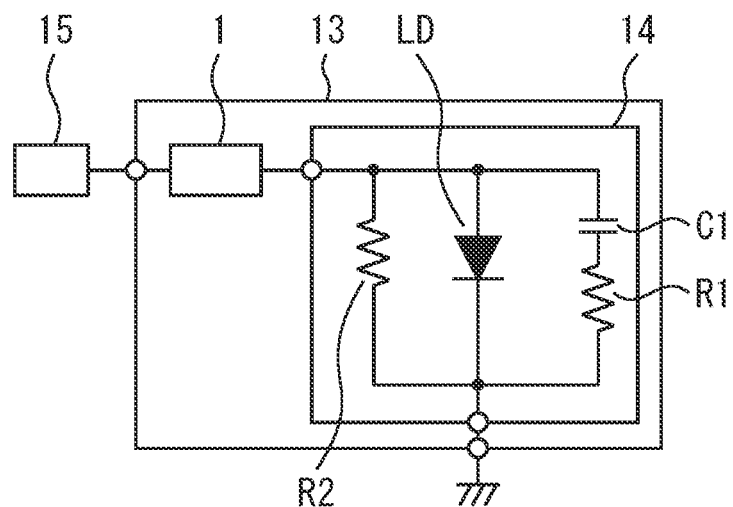
FIG. 4 is a circuit diagram of a photo-semiconductor apparatus according to the first embodiment.

FIG. 4 is a circuit diagram of a photo-semiconductor apparatus according to the first embodiment. A package 14 of a photo-semiconductor apparatus 13 and a driving circuit 15 are connected together via the flexible substrate 1. The photo-semiconductor apparatus 13 is a TOSA (transmitter optical sub-assembly). In the photo-semiconductor apparatus 13, a light emitting device LD, a termination resistor R1, a capacitor C1, and a resistor R2 are arranged in an internal portion of the package 14. The light emitting device LD is an EML-LD (electro-absorption modulator laser diode), for example. The light emitting device LD is in parallel connected with the resistor R2. The capacitor C1 and the termination resistor R1 are in series connected with each other and are in parallel connected with the light emitting device LD and the resistor R2. An anode of the light emitting device LD is connected with the driving circuit 15, and a cathode is connected with a GND. The light emitting device LD emits light in accordance with a high-frequency modulated electric signal which is supplied from the driving circuit 15. Note that arrangement may be made in order of the termination resistor R1 and the capacitor C1 from the driving circuit 15 side.

Figure 5:
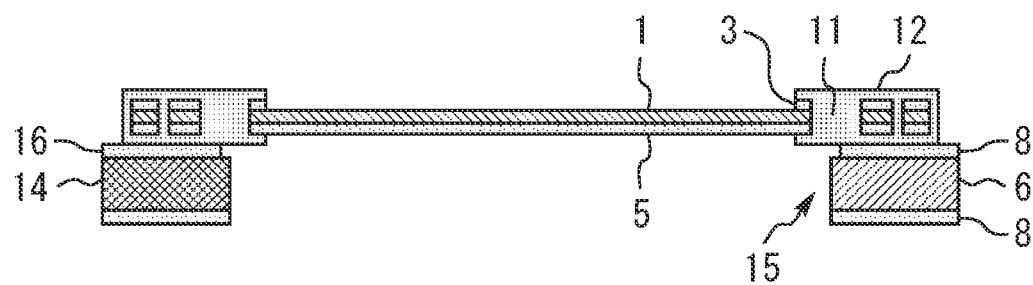
FIG. 5 is a cross-sectional view illustrating a connection structure between the package of the photo-semiconductor apparatus and the driving circuit by using the flexible substrate.

FIG. 5 is a cross-sectional view illustrating a connection structure between the package of the photo-semiconductor apparatus and the driving circuit by using the flexible substrate. The substrate joining structure of the present embodiment is applied to connection between one end of the flexible substrate 1 and the driving circuit 15. However, the substrate joining structure of the present embodiment may be applied to connection between another end of the flexible substrate 1 and a pattern 16 of the package 14.

Figure 6:
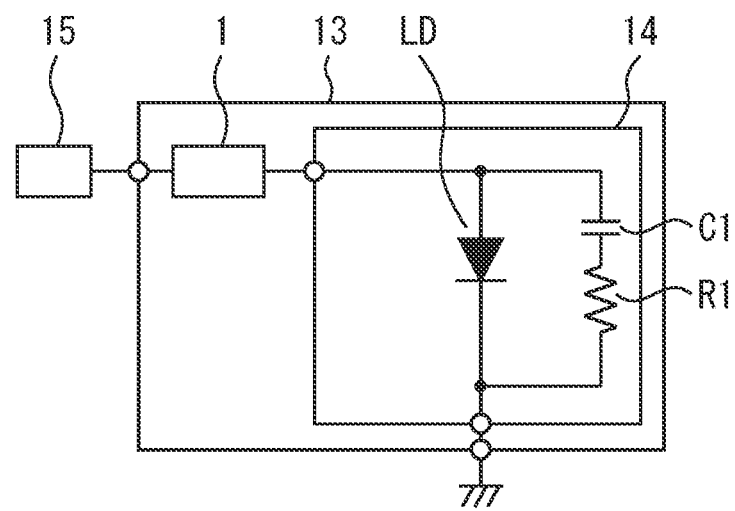
FIG. 6 is a circuit diagram illustrating a modification of the photo-semiconductor apparatus including the substrate joining structure according to the first embodiment.
Figure 7:
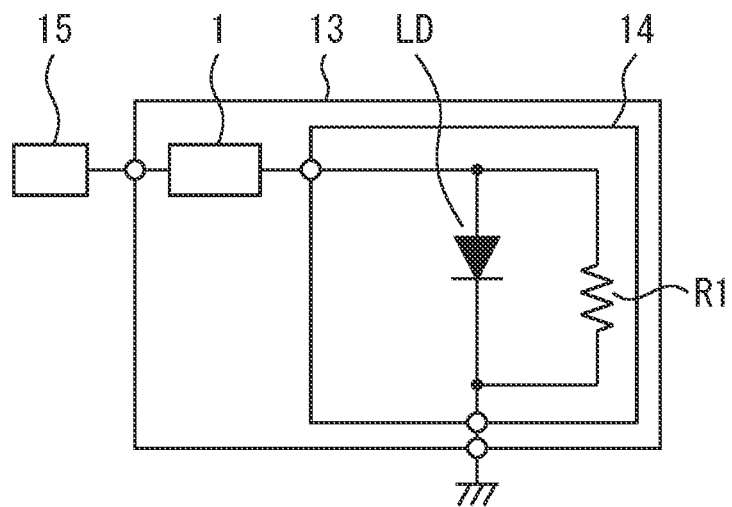
FIG. 7 is a circuit diagram illustrating a modification of the photo-semiconductor apparatus including the substrate joining structure according to the first embodiment.
Figure 8:
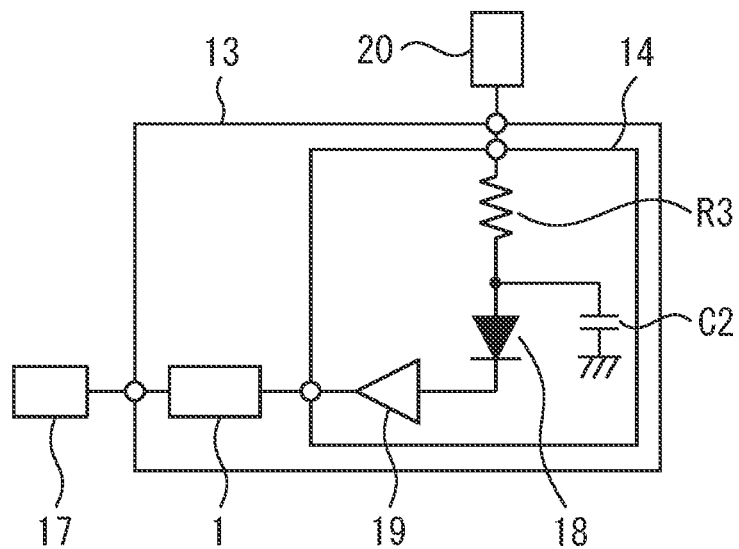
FIG. 8 is a circuit diagram illustrating a modification of the photo-semiconductor apparatus including the substrate joining structure according to the first embodiment.

FIG. 6 to FIG. 8 are circuit diagrams illustrating modifications of the photo-semiconductor apparatus including the substrate joining structure according to the first embodiment. FIG. 6 illustrates a case where no resistor R2 is provided, and FIG. 7 illustrates a case where neither the resistor R2 nor capacitor C1 is provided.

The photo-semiconductor apparatus 13 in FIG. 8 is a ROSA (receiver optical sub-assembly). Connection between the package 14 of the photo-semiconductor apparatus 13 and a signal circuit 17 is made by the flexible substrate 1. In the photo-semiconductor apparatus 13, a light receiving device 18, a capacitor C2, a resistor R3, and a transimpedance amplifier 19 are arranged in the internal portion of the package 14. The light receiving device 18 is an APD (avalanche photo diode), for example. An anode of the light receiving device 18 is connected with a power feeding circuit 20 via the resistor R3, and a cathode is connected with an input of the transimpedance amplifier 19. An output of the transimpedance amplifier 19 is connected with the signal circuit 17 via the flexible substrate 1. A capacitor C is in parallel connected with the light receiving device 18. Further, any or all of the capacitor C2, the resistor R3, and the transimpedance amplifier 19 may be omitted.

Figure 9:
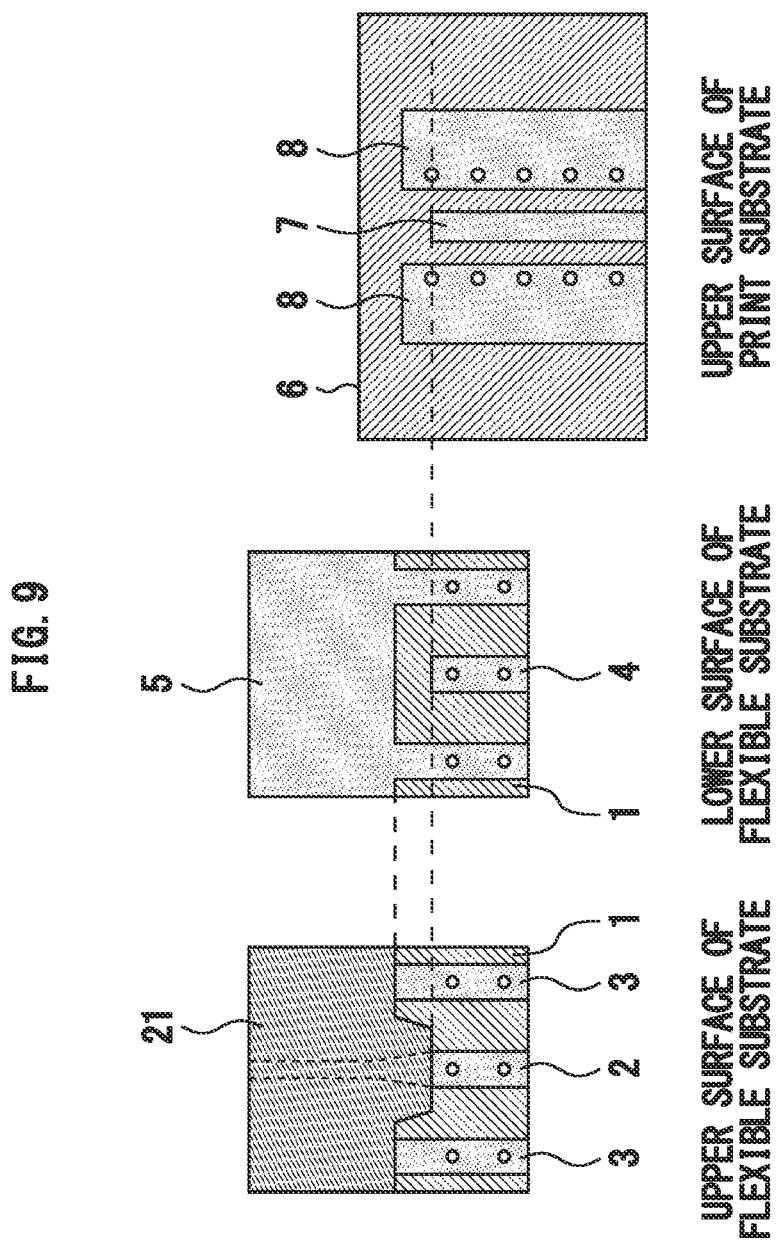
FIG. 9 is a diagram illustrating upper and lower surfaces of a flexible substrate and an upper surface of a print substrate, according to the comparative example.

Next, effects of the present embodiment will be described by a comparison with a comparative example. FIG. 9 is a diagram illustrating upper and lower surfaces of a flexible substrate and an upper surface of a print substrate, according to the comparative example. In order to prevent breaking of wire of the pattern, a protrusion portion is provided in a coverlay film 21 covering the conductive pattern 2 on the upper surface of the flexible substrate 1, and an end portion of a solder joint portion is thereby shifted from a part where the flexible substrate 1 bends. However, a manufacture tolerance of the coverlay film 21 includes a sticking-out portion of an adhesive in addition to a lamination tolerance. Consequently, the manufacture tolerance of the coverlay film 21 is as large as approximately +400 µm. Thus, there may be a case where the end portion of the solder joint portion is not sufficiently shifted from the part where the flexible substrate 1 bends and breaking of wire occurs to the conductive pattern 2 on a front surface or to the GND pattern 5 on a back surface.

On the other hand, in the present embodiment, the through holes 11 are provided which pass through the flexible substrate 1 and connect the GND patterns 3 and 5 together. Because the through hole 11 is formed by drill processing or laser processing, a manufacture tolerance of the through hole 11 is as small as +50 to 100 µm. The through holes 11 are filled with the solder 12 when the flexible substrate 1 and the print substrate 6 are joined together by the solder 12. In the extension direction in which the conductive pattern 4 extends, the end portion of the solder joint portion between the conductive pattern 4 and the conductive pattern 7 is in the position corresponding to the through holes 11 and is shifted from the end portion of the through hole 11. A stress concentration point in bending of the flexible substrate 1 is positioned in the end portion of the through hole 11 (see a dotted line C in FIG. 3), a stress is not exerted on the end portion of the solder joint portion, and breaking of wire can thus be prevented.

Second Embodiment

Figure 10:
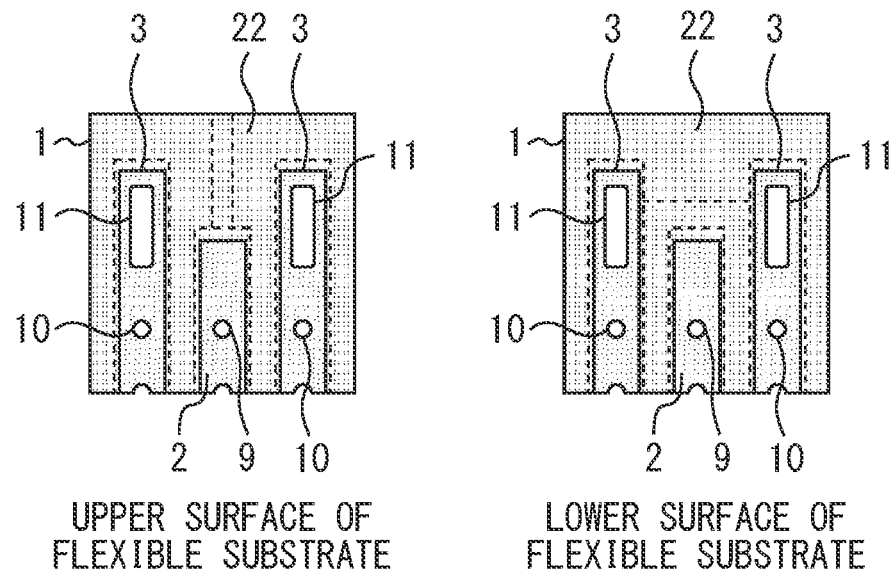
FIG. 10 is a diagram illustrating upper and lower surfaces of a flexible substrate according to a second embodiment.

FIG. 10 is a diagram illustrating upper and lower surfaces of a flexible substrate according to a second embodiment. On the upper surface and the lower surface of the flexible substrate 1, a solder resist 22 is provided on portions which are not desired to be coated with the solder 12. The solder resist 22 is PSR-4000 G24K/CA-40 G24 produced by TAIYO INK MFG. CO., LTD., for example.

Figure 11:
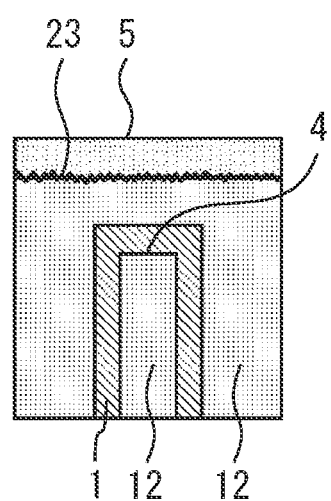
FIG. 11 is a diagram illustrating the lower surface of the flexible substrate, for which solder joining is performed without the solder resist being provided.

FIG. 11 is a diagram illustrating the lower surface of the flexible substrate, for which solder joining is performed without the solder resist being provided. The solder 12 wets and spreads on a large portion of the GND pattern 5. In this case, there is a possibility that when a stress is exerted on the flexible substrate 1, a wire-breakage portion 23 is produced in a solder boundary portion, and breaking of wire thereby occurs to the GND pattern 5.

Figure 12:
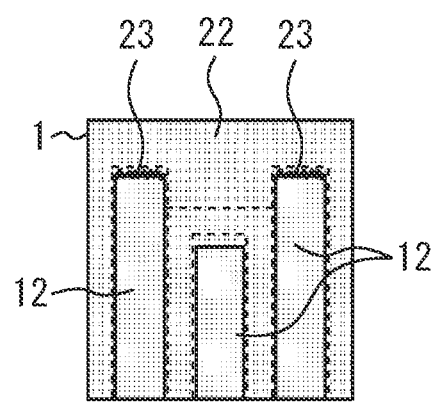
FIG. 12 is a diagram illustrating the lower surface of the flexible substrate, for which solder joining is performed while the solder resist is provided.

FIG. 12 is a diagram illustrating the lower surface of the flexible substrate, for which solder joining is performed while the solder resist is provided. By providing the solder resist 22, a place which the solder 12 wets and spreads on can be controlled when the flexible substrate 1 and the print substrate 6 are joined together by the solder. Even when the solder 12 wets and spreads on the GND pattern 5, wetting and spreading can be prevented by the solder resist 22. There is a possibility that when a stress is exerted on the flexible substrate 1, the wire-breakage portion 23 is produced in the distal of the solder joint portion, but breaking of wire does not occur to the GND pattern 5. Thus, the flexible substrate 1 can be used without influencing characteristics. Note that the solder resist 22 may be a coverlay film. Other configurations and effects are similar to those of the first embodiment.

Third Embodiment

Figure 13:
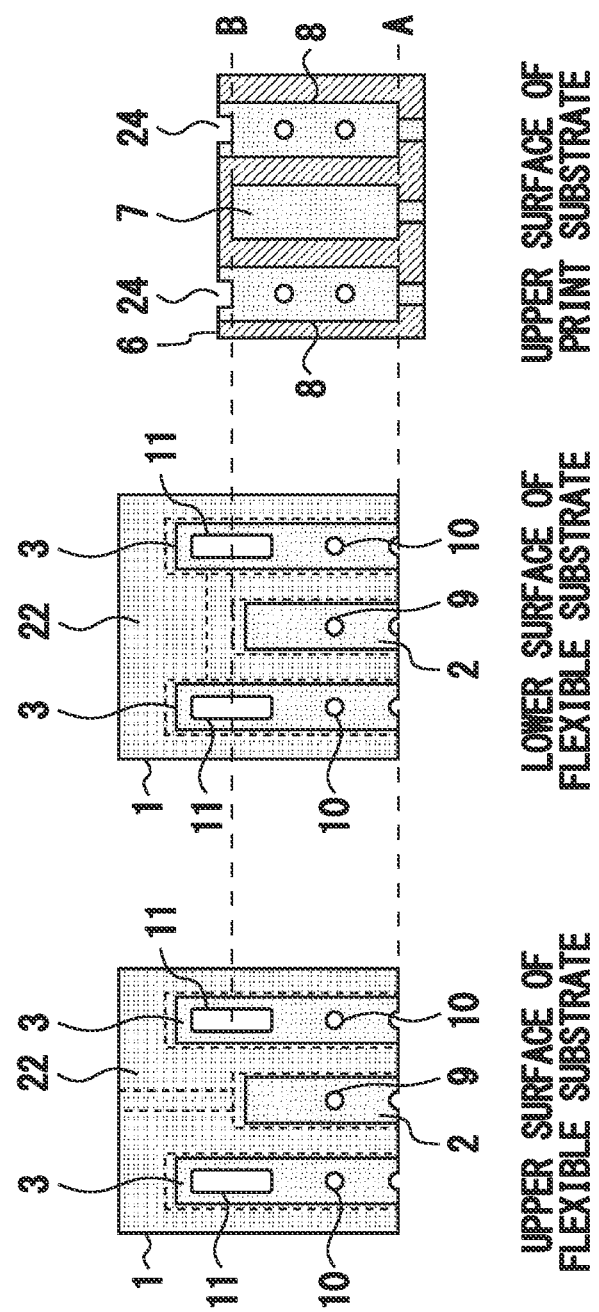
FIG. 13 is a diagram illustrating upper and lower surfaces of a flexible substrate and an upper surface of a print substrate, according to a third embodiment.

FIG. 13 is a diagram illustrating upper and lower surfaces of a flexible substrate and an upper surface of a print substrate, according to a third embodiment. In a distal end portion of the GND pattern 8, a castellation 24 is provided in a side surface of the print substrate 6. The castellation 24 is one portion of a substrate side surface, the portion being notched and metallized. As indicated by a dotted line B in FIG. 13, a recess portion of the castellation 24 is positioned to the center of the long side of the through hole 11. Note that the solder resist 22 does not have to be provided.

Figure 14:
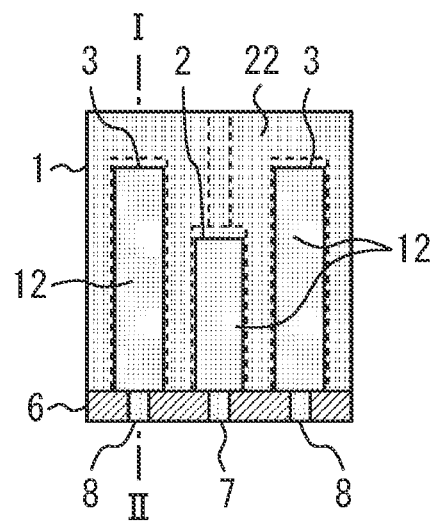
FIG. 14 is a top view illustrating a substrate joining structure according to the third embodiment.
Figure 15:
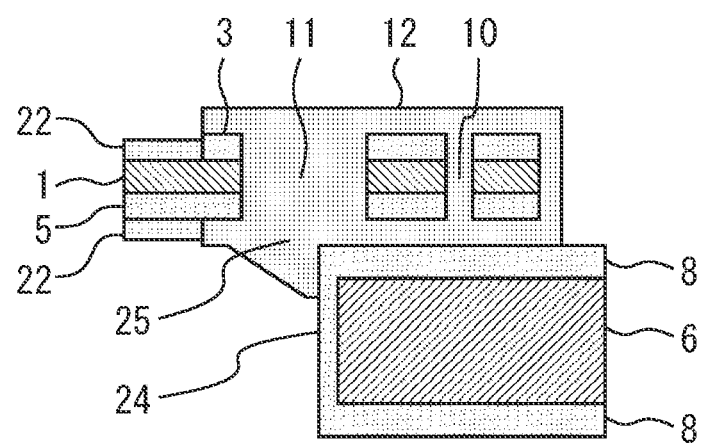
FIG. 15 is a cross-sectional view taken along line I-II in FIG. 14.

FIG. 14 is a top view illustrating a substrate joining structure according to the third embodiment. FIG. 15 is a cross-sectional view taken along line I-II in FIG. 14. When the flexible substrate 1 and the print substrate 6 are joined together by the solder 12, the solder 12 wets and spreads on the castellation 24, and a solder bridge 25 is thereby formed. The solder joint portion of the flexible substrate 1 is made less likely to bend by the solder 12, with which insides of the through holes 11 of the flexible substrate 1 are filled, and by the solder bridge 25. Accordingly, a stress on the solder joint portion can be reduced, and breaking of wire can be prevented. Further, because it is not necessary to perform reinforcement using a resin for preventing breaking of wire, manufacture becomes easy.

Figure 16:
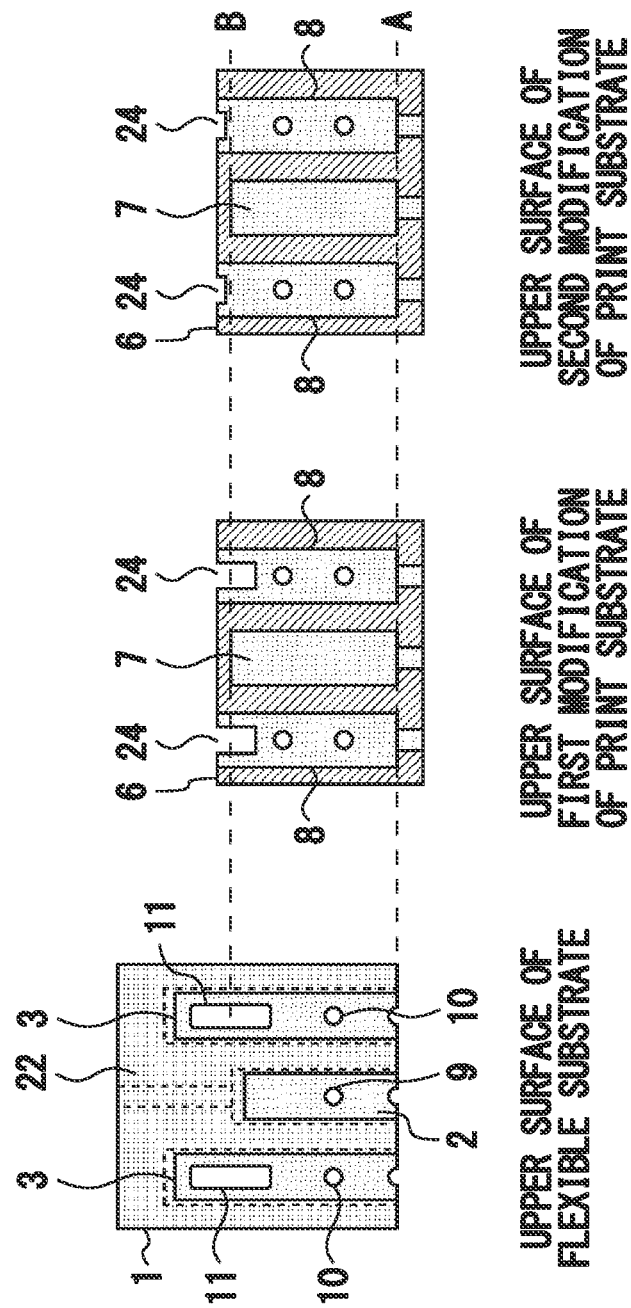
FIG. 16 is a diagram illustrating the upper surface of the flexible substrate according to the third embodiment and upper surfaces of first and second modifications of the print substrate.

FIG. 16 is a diagram illustrating the upper surface of the flexible substrate according to the third embodiment and upper surfaces of first and second modifications of the print substrate. The recess portions of the castellations 24 are shifted from the center of the long side of the through hole 11. In those cases also, similar effects can be obtained.

Fourth Embodiment

Figure 17:
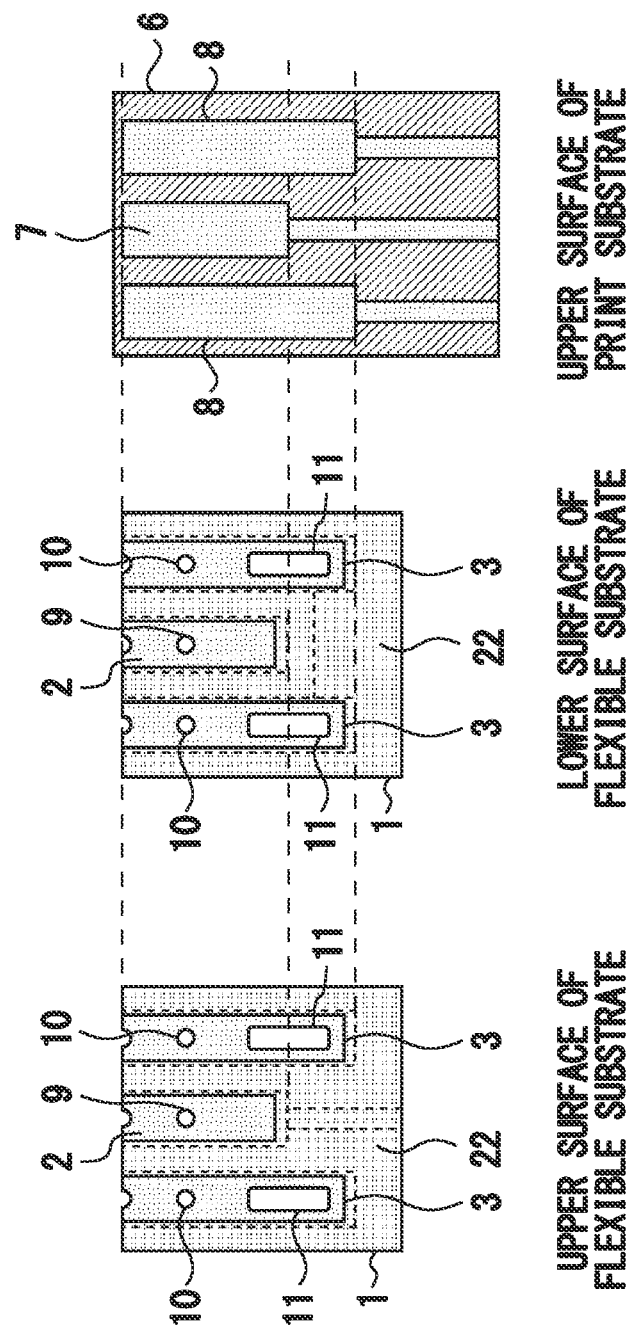
FIG. 17 is a diagram illustrating upper and lower surfaces of a flexible substrate and an upper surface of a print substrate, according to a fourth embodiment.
Figure 18:
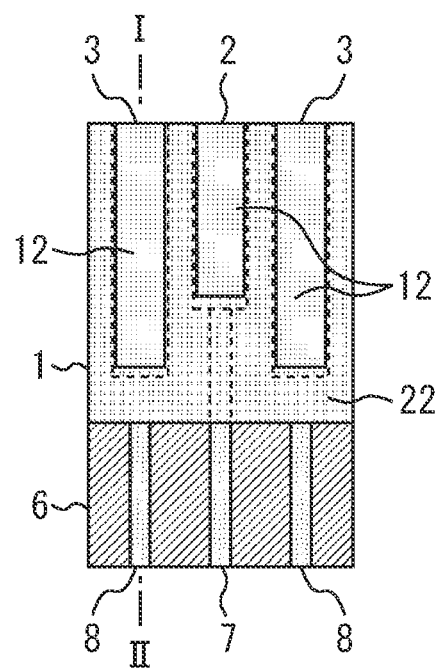
FIG. 18 is a top view illustrating a substrate joining structure according to the fourth embodiment.
Figure 19:
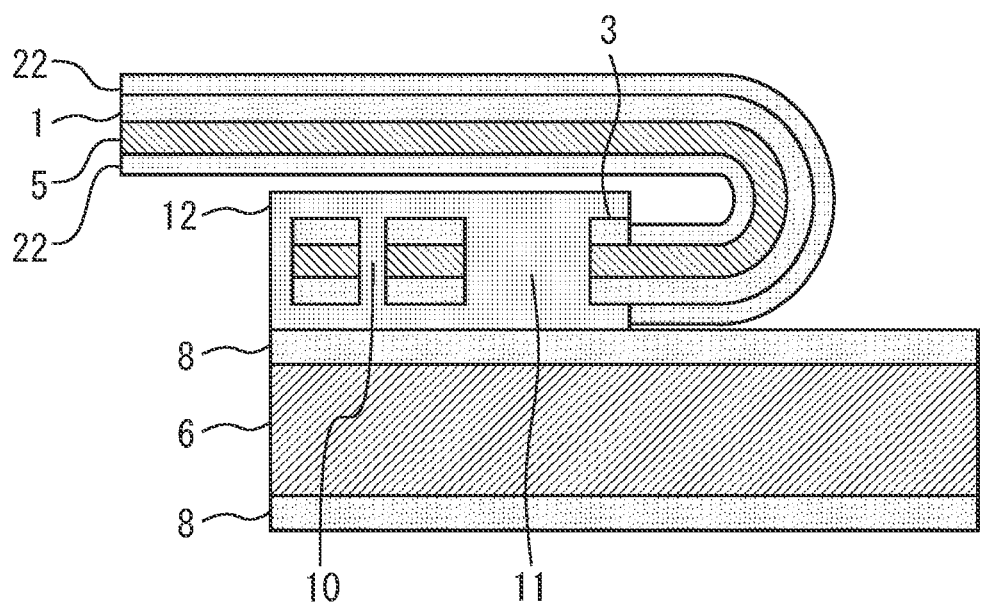
FIG. 19 is a cross-sectional view taken along line I-II in FIG. 18.

FIG. 17 is a diagram illustrating upper and lower surfaces of a flexible substrate and an upper surface of a print substrate, according to a fourth embodiment. FIG. 18 is a top view illustrating a substrate joining structure according to the fourth embodiment. FIG. 19 is a cross-sectional view taken along line I-II in FIG. 18. The flexible substrate 1 extending from the solder joint portion is folded to a 180° opposite side.

Forming is performed such that the flexible substrate 1 is initially bent, and a stress exerted after joining by the solder 12 can thereby be dispersed. Accordingly, a stress on the solder joint portion is reduced, and breaking of wire can thereby be prevented. Further, in a case where joining strength between the flexible substrate 1 and the print substrate 6 is weak, the solder 12 comes off when a stress is exerted, and breaking of wire occurs. Thus, the joining strength is increased by filling the through holes 11 with the solder 12, and breaking of wire can thereby further be prevented.

Fifth Embodiment

Figure 20:
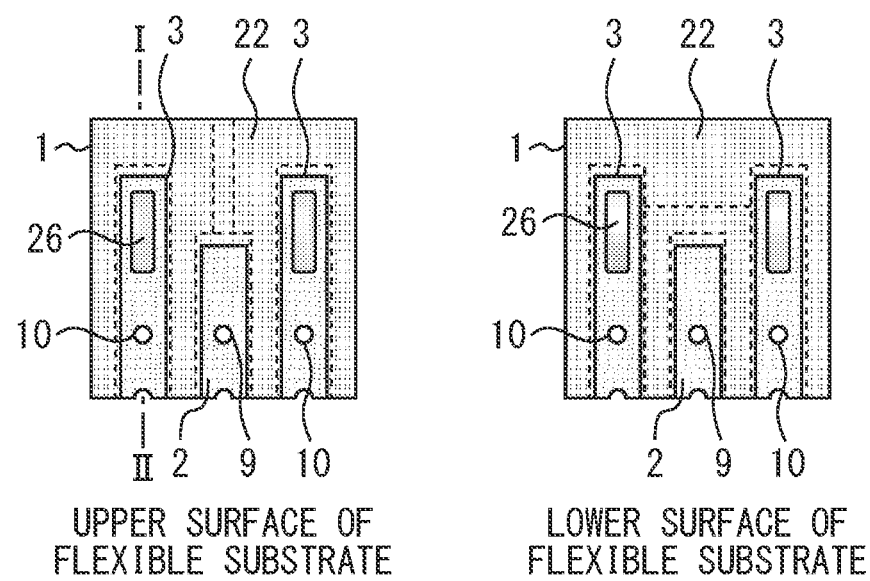
FIG. 20 is a diagram illustrating upper and lower surfaces of a flexible substrate according to a fifth embodiment.

FIG. 20 is a diagram illustrating upper and lower surfaces of a flexible substrate according to a fifth embodiment. The through hole 11 is filled with metal 26. The metal 26 is metal, which is harder than the solder 12, such as copper, for example. Because when a stress is exerted on the flexible substrate 1, the flexible substrate 1 is less likely to bend than a case where the through holes 11 are filled with the solder 12, breaking of wire can further be prevented.

Figure 21:
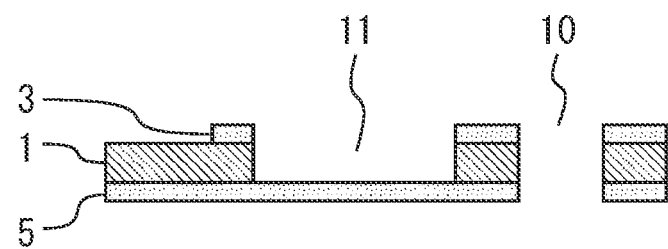
FIG. 21 is a cross-sectional view illustrating a manufacturing step of the flexible substrate according to the fifth embodiment.
Figure 22:
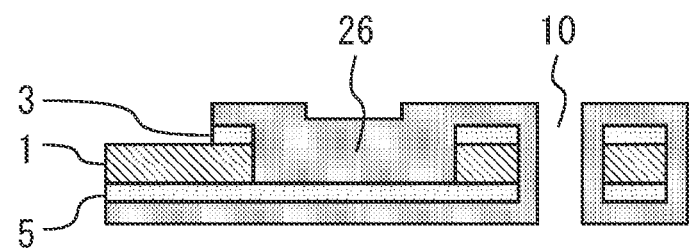
FIG. 22 is a cross-sectional view illustrating a manufacturing step of the flexible substrate according to the fifth embodiment.

FIG. 21 and FIG. 22 are cross-sectional views illustrating manufacturing steps of the flexible substrate according to the fifth embodiment. FIG. 21 and FIG. 22 correspond to a cross-sectional view taken along line I-II in FIG. 20. First, as illustrated in FIG. 21, the through holes 11 are formed by removing a part of the flexible substrate 1 and a part of the GND patterns 3 on the front surface side. In this case, the GND pattern 5 on the back surface side is not taken away (blind via structure). Next, as illustrated in FIG. 22, the through holes 11 are filled with the metal 26 by applying copper plating. Other configurations and effects are similar to those of the first embodiment.

REFERENCE SIGNS LIST 1 flexible substrate; 2,4,7 conductive pattern; 3,5,8 GND pattern; 6 print substrate; 11 through hole; 12 solder; 22 solder resist; 24 castellation; 26 metal

The invention claimed is:
1. A substrate joining structure comprising:
a flexible substrate;
a first conductive pattern and a first GND pattern provided side by side on an upper surface of the flexible substrate;
a second conductive pattern and a second GND pattern provided side by side on a lower surface of the flexible substrate; and
a print substrate;
a third conductive pattern and a third GND pattern provided side by side on an upper surface of the print substrate; and
solder joining together the second conductive pattern and the third conductive pattern and joining together the second GND pattern and the third GND pattern,
wherein a through hole passes through the flexible substrate and connects the first and second GND patterns together, and
in an extension direction in which the second conductive pattern extends, an end portion of a solder joint portion between the second conductive pattern and the third conductive pattern is in a position corresponding to the through hole and is shifted from an end portion of the through hole.

2. The substrate joining structure according to claim 1, wherein the through hole is filled with the solder.

3. The substrate joining structure according to claim 1, wherein the through hole is filled with metal.

4. The substrate joining structure according to claim 1, wherein the through hole is in a rectangular shape having a long side along the extension direction, and
the end portion of the solder joint portion is positioned at a center of the long side of the through hole in the extension direction.

5. The substrate joining structure according to claim 1, further comprising a solder resist provided on the flexible substrate.

6. The substrate joining structure according to claim 1, wherein a castellation is provided in a side surface of the print substrate in a distal end portion of the third GND pattern.

7. The substrate joining structure according to claim 1, wherein the flexible substrate extending from the solder joint portion between the second conductive pattern and the third conductive pattern is folded to an opposite side.

* * * * *